(12) United States Patent
Nakatani et al.

(10) Patent No.: US 8,310,152 B2
(45) Date of Patent: Nov. 13, 2012

(54) ORGANIC EL DEVICE AND EL DISPLAY PANEL HAVING A LOW DRIVING VOLTAGE AND HIGH LIGHT EMITTING FREQUENCY, AND METHOD FOR MANUFACTURING

(75) Inventors: Shuhei Nakatani, Osaka (JP); Hidehiro Yoshida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/741,236

(22) PCT Filed: Dec. 2, 2008

(86) PCT No.: PCT/JP2008/003563
§ 371 (c)(1),
(2), (4) Date: May 4, 2010

(87) PCT Pub. No.: WO2009/075075
PCT Pub. Date: Jun. 18, 2009

(65) Prior Publication Data
US 2010/0252857 A1  Oct. 7, 2010

(30) Foreign Application Priority Data

Dec. 10, 2007  (JP) ................................ 2007-318978

(51) Int. Cl.
*H01L 51/52* (2006.01)
*H01L 51/56* (2006.01)

(52) U.S. Cl. ............ 313/506; 445/24; 445/25; 313/507; 313/508; 257/100

(58) Field of Classification Search .......... 313/498–512; 445/24–25
See application file for complete search history.

(56) References Cited

U.S. PATENT DOCUMENTS 6,755,983 B2 * 6/2004 Yudasaka .......................... 216/5
2004/0189194 A1 * 9/2004 Kihara et al. .................. 313/506
(Continued)

FOREIGN PATENT DOCUMENTS
JP  2002-372921  12/2002
(Continued)

OTHER PUBLICATIONS

Search report from E.P.O. In European Application No. 08859620.0, mail date of Oct. 26, 2011.

*Primary Examiner* — Tracie Y Green
(74) *Attorney, Agent, or Firm* — Greenblum & Bernstein, P.L.C.

(57) ABSTRACT

Disclosed is a method for manufacturing an organic EL device which comprises a hole injection layer having a flat surface that is not contaminated. Specifically disclosed method for manufacturing an organic EL device, which comprises a step of forming an anode on a substrate; a step of forming a hole injection layer on the anode; a step of forming an inorganic film on the substrate and the hole injection layer; a step of forming a bank on the inorganic film in such a manner that at least a part of the inorganic film formed on the hole injection layer is exposed; a step of etching the exposed inorganic film by using the bank as a mask so that the hole injection layer is exposed therefrom; and a step of forming an organic light-emitting layer by applying an organic light-emitting material onto the exposed hole injection layer. The hole injection layer contains tungsten oxide or molybdenum oxide.

10 Claims, 11 Drawing Sheets

U.S. PATENT DOCUMENTS

| | | |
|---|---|---|
| 2005/0052127 A1* | 3/2005 | Sakata et al. .................. 313/506 |
| 2005/0057152 A1 | 3/2005 | Park |
| 2005/0112341 A1* | 5/2005 | Ito et al. ........................ 428/209 |
| 2005/0116632 A1 | 6/2005 | Funamoto et al. |
| 2007/0103062 A1 | 5/2007 | Jung et al. |
| 2007/0224907 A1* | 9/2007 | Hayashi et al. ................. 445/24 |
| 2007/0241665 A1 | 10/2007 | Sakanoue et al. |
| 2007/0246723 A1* | 10/2007 | Moriya et al. ................... 257/98 |
| 2007/0278942 A1 | 12/2007 | Jung et al. |
| 2009/0160322 A1 | 6/2009 | Yoshida et al. |
| 2009/0321725 A1 | 12/2009 | Yoshida et al. |

FOREIGN PATENT DOCUMENTS

| | | |
|---|---|---|
| JP | 3743630 | 11/2005 |
| JP | 2006-114928 | 4/2006 |
| JP | 2007-026866 | 2/2007 |
| JP | 2007-073284 | 3/2007 |
| JP | 2007-095415 | 4/2007 |
| JP | 2007-134327 | 5/2007 |
| JP | 2007-288074 | 11/2007 |
| JP | 2007-317519 | 12/2007 |
| JP | 2008-243406 | 10/2008 |

* cited by examiner

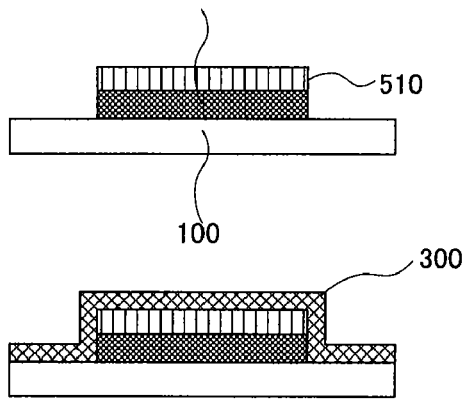
FIG.8A
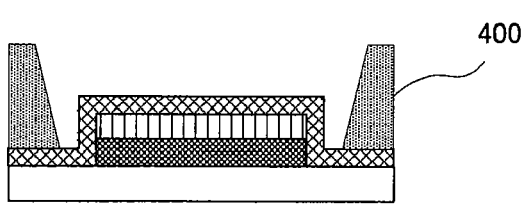
FIG.8B
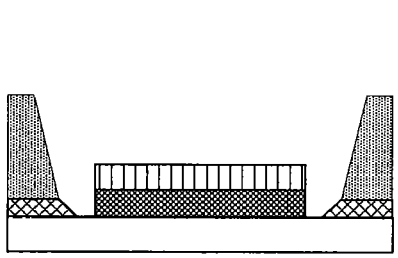
FIG.8C
FIG.8D
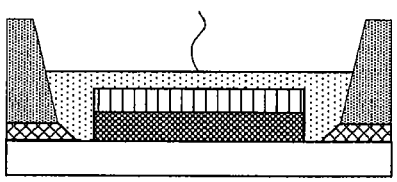
FIG.8E
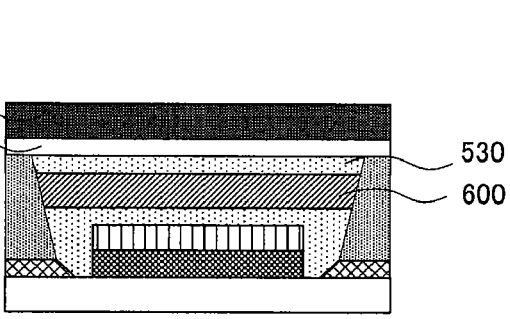
FIG.8F

ORGANIC EL DEVICE AND EL DISPLAY PANEL HAVING A LOW DRIVING VOLTAGE AND HIGH LIGHT EMITTING FREQUENCY, AND METHOD FOR MANUFACTURING

TECHNICAL FIELD

The present invention relates to an organic EL device, an organic EL display panel and a manufacturing method of the same.

BACKGROUND ART

In recent years, as candidates for post-liquid crystal displays and post-plasma displays, research and development are being extensively undertaken in relation to self-luminous displays represented by organic EL displays. The current organic EL displays are of two types: One is a low molecular weight type organic EL display in which a low molecular weight organic compound is used in a light emitting layer; the other is a high molecular weight type organic EL device in which a high molecular weight organic compound is used.

At present, for their high light emission efficiency, long life and the like, development of low molecular weight type EL displays in which a light emitting layer is prepared by using vacuum process such as vacuum deposition is ahead. However, the organic light emitting layer of the high molecular weight type EL display can be prepared by the wet-process such as the ink-jet method or the gravue printing method. Therefore, the productivity of the high molecular weight type organic EL display is much higher than that of the low molecular weight type organic EL display.

In the manufacturing of the high molecular weight type organic EL display, generally, for providing an organic light emitting material on the electrode, a barrier wall (hereinafter referred to as "bank") surrounding the electrode is formed and an composition containing an organic light emitting material is applied to the region defined by the bank. The bank was usually formed by patterning a layer of the bank material applied on the substrate by the photolithography method. In addition, there is also a known technology to control the wettability of the bank by providing a layer made of silicon oxide between the bank and the substrate.

In addition, in the organic EL device, typically a hole injection layer is arranged between the anode and the organic light emitting layer. The hole injection layer has a function to support the injection of holes from the anode to the organic light emitting layer. In recent years, it was discovered that metal oxides such as tungsten oxide can be used as the material of the hole injection layer (See, for example, Patent Document 2,)

Patent Document 1: Japanese Patent No. 3743630
Patent Document 2: Japanese Patent Application Laid-Open No. 2006-114928

DISCLOSURE OF THE INVENTION

Problems to be Solved by the Invention

In the case when the region in which an ink is applied is defined by the bank, after laminating the hole injection layer made of metal oxide on the anode by sputtering or the like, and then the bank is formed by patterning using the photolithography method or the like. However, since the hole injection layer made of metal oxide is dissolved in water and alkali, the layer is dissolved in the course of bank formation in which etching with alkaline solution is conducted and there was cases in which the flatness of the surface of the hole injection layer is deteriorated. In the case when the surface of the hole injection layer is not flat, the work function of the hole injection layer varies and thus there was a concern that the light emitting efficiency of the organic EL device is decreased. Furthermore, in the case when the hole injection layer was dissolved by an alkaline solution, there was a case in which surface roughness of the hole injection layer became large. When the surface roughness of the hole injection layer becomes large, it becomes difficult for the functional layer to be formed on the hole injection layer to cover the entire surface of the hole injection layer, and thus there was a case of occurrence of the short circuit of the organic EL device.

In addition, in the case when the bank was formed after the hole injection layer was formed, there was a case in which the surface of the hole injection layer was contaminated by the residues of the bank. When the surface of the hole injection layer was contaminated by the residues of the bank, the work function of the hole injection layer varies and there was a concern of lowering of the light emitting efficiency of the organic EL device. In addition, since the bank is an insulating body, when the surface of the hole injection layer is contaminated by the residues of the bank, the surface resistance of the hole injection layer increases, and then the driving voltage of the organic EL device increases.

An object of the present invention is to provide a method for manufacturing an organic EL device with low driving voltage and high light emitting efficiency, by preventing the hole injection layer from dissolution and by protecting the surface of the hole injection layer from the contamination of the residues of the bank.

Means for Solving the Problem

Namely, a first aspect of the present invention relates to an organic EL device described below.

[1] An organic EL device including: a substrate; an anode arranged on the substrate; a hole injection layer consisting of transition metal oxides arranged on the anode; an organic light emitting layer arranged on the hole injection layer; the anode arranged on the organic light emitting layer; an inorganic film arranged on the substrate; and a bank arranged on the inorganic film; wherein:

the bank and the inorganic film define the region of the organic light emitting layer;

no difference in level is present in the boundary between the bank and the inorganic film;

the bottom face of the inorganic film extends in the region defined by the bank and the inorganic film farther than the top face of the inorganic film.

[2] The organic EL device described in [1], wherein the bank comprises a fluorine containing resin.

[3] The organic EL device described in [1] or [2], wherein the bank has a forward tapered shape.

[4] The organic EL device described in any one of [1] to [3], wherein:

the thickness of the inorganic film is from 5 nm to 100 nm;
the material of the inorganic film is selected from silicon, silicon oxide, silicon nitride or silicon oxynitride.

[5] The organic EL device described in any one of [1] to [3], wherein:

the thickness of the inorganic film is from 5 nm to 100 nm;
the material of the inorganic film is selected from chromium, nickel, copper, aluminum, silver, gold, platinum, APC, ITO, AL-Nd alloy, and titanium

[6] The organic EL device described in any one of [1] to [5], wherein:

the wettability of the top face of the bank is lower than that of the wall face of the bank; and the wettability of the wall face of the bank is lower than that of the inorganic film.

A second aspect of the present invention relates to a manufacturing method of an organic EL device, as described below:

[7] A manufacturing method of an organic EL device including:

forming an anode on a substrate;

a step to form a hole injection layer consisting of transition metal oxides on the anode;

forming an inorganic film on the substrate and the hole injection layer;

forming a bank on the inorganic film such that at least a part of the inorganic film formed on the hole injection layer is exposed;

exposing the hole injection layer by etching the inorganic film at the exposed site using the bank as the mask;

forming an organic light emitting layer by applying an organic emitting material on the exposed hole injection layer; and forming a cathode on the organic light emitting layer.

[8] The manufacturing method of the organic EL device described in [7], wherein:

the material of the inorganic film is selected from chromium, nickel, copper, aluminum, silver, gold, platinum, APC, ITO, AL-Nd alloy, and titanium; and the inorganic film is subjected to etching using mixed acid.

[9] The manufacturing method of the organic EL device described in [7], wherein:

the material of the inorganic film is selected from silicon, silicon oxide, silicon nitride, and silicon oxynitride; and the inorganic film is subjected to etching using hydrofluoric acid.

[10] The manufacturing method of the organic EL device described in any one of [7] to [9], wherein:

the bank comprises a fluorine-containing resin; and the bank is formed by the photolithography method.

A third aspect of the present invention relates to an organic EL display panel shown below.

[11] An organic EL display panel having two or more organic EL devices described in any one of [1] to [3] arranged on the same plane, wherein:

the material of the inorganic film is selected from chromium, nickel, copper, aluminum, silver, gold, platinum, APC, ITO, AL-Nd alloy, and titanium; and the inorganic films of the neighboring organic EL devices are separated from each other.

[12] An organic EL display panel comprising two or more organic EL devices described in any one of [1] to [3] arranged on the same flat plane, wherein:

the material of the inorganic film is selected from silicon, silicon oxide, silicon nitride, and silicon oxynitride;

the inorganic films of the neighboring organic EL devices are connected to each other; and the connected inorganic films form a grid.

ADVANTAGEOUS EFFECTS OF THE INVENTION

According to the present invention, since the hole infusion layer is protected from dissolution by an alkaline solution and the contamination by the residues of the bank, it is possible to obtain a hole injection layer having a constant work function, and also to decrease the surface resistance of the hole infusion layer. For these reasons, an organic EL device with low driving voltage and high light emitting efficiency can be provided.

In addition, according to the present invention, the generation of the region where the organic light emitting material is not applied can be prevented in the region on the hole injection layer.

BRIEF DESCRIPTION OF DRAWINGS

FIGS. 8A to 8F show a manufacturing flow chart of the organic EL device of the embodiment 2;

BEST MODE FOR CARRYING OUT THE INVENTION

Now, embodiments of the present invention will be described in detail with reference to the accompanying drawings.

1. Manufacturing Method of Organic EL Device of the Present Invention

The manufacturing method of the organic EL device of the invention comprises:

1) a first step to form an anode on a substrate;

2) a second step to form a hole injection layer on the anode;

3) a third step to form an inorganic film on the substrate and the hole injection layer;

4) a forth step to form a bank on the inorganic film;

5) a fifth step to expose the hole injection layer by etching the inorganic film using the bank as a mask;

6) a sixth step to form an organic light emitting layer by applying an organic emitting material on the exposed hole injection layer; and 7) a seventh step to form a cathode on the organic light emitting layer.

1) In the first step, an anode is formed on the substrate. The anode may be formed, for example, by subjecting the conductive film formed on the substrate by sputtering and the like to patterning through etching and the like, however, the method is not limited.

2) In the second step, a hole injection layer is formed on the anode. The material of the hole injection layer is a transition metal oxide. The hole injection layer is formed, for example, by sputtering, on the anode.

3) In the third step, an inorganic film is formed on the substrate and the hole injection layer to cover the hole injection layer. The inorganic film is formed, for example, by sputtering. It is preferable that the material of the inorganic film has a higher wettability than that of the bank to be described later. Furthermore, the material of the inorganic film may be either conductive or insulative.

4) In the forth step, a bank is formed on the inorganic film. It is preferable that the bank has a forward tapered shape. In addition, since the bank defines the region where the organic light emitting material to be described later is applied, it is preferable that the wettability is low. For lowering the wettability of the bank, the bank may be subjected to plasma treatment with a fluorine gas or a fluorine containing resin may be used as the material of the bank.

However, in the case when the plasma treatment is conducted using a fluorine gas, fluorine does not bind to the surface of the bank chemically, but is simply absorbed on the surface of the bank by the inter molecular force. Therefore, even when fluorine is absorbed on the surface of the bank by the plasma treatment, there are cases in which migration of fluorine occurs by the thermal process and the like. If fluorine having a large electron-withdrawing ability migrates, for example, to the organic light emitting layer to be described later, there is a concern that it adversely affect the emitting efficiency and the like by inactivating the photoluminescent exciton.

Figure 1:
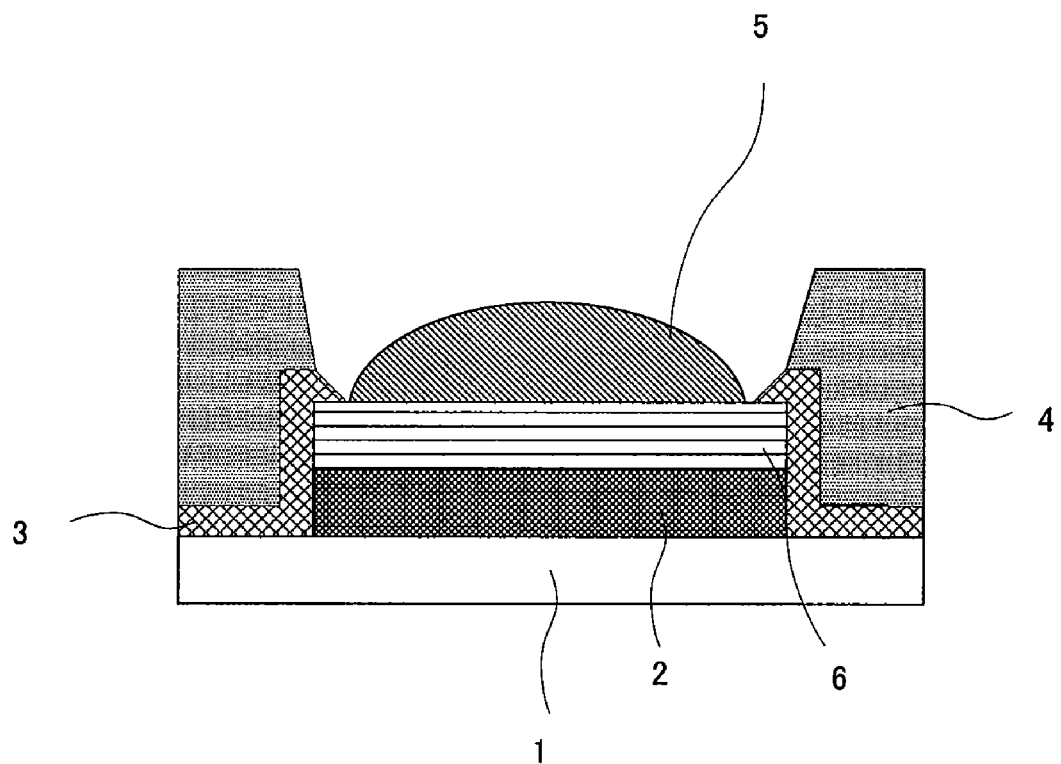
FIG. 1 is a cross-sectional view of the organic light emitting layer in the case when the bank is subjected to the plasma treatment with a fluorine gas.

In addition, in the case when the bank is subjected to the plasma treatment using a fluorine gas, the wettability is decreased not only on the top face of the bank, but also on the wall face of the bank. FIG. 1 shows a state in which organic light emitting material 5 to be described later is applied in the region defined by bank 4 subjected to plasma treatment. The symbol 1 in FIG. 1 represents a substrate, the symbol 2 represents an electrode, the symbol 3 represents an inorganic film to be described later and the symbol 6 represents a hole injection layer.

As shown in FIG. 1, in the case when bank 4 is subjected to plasma treatment with a fluorine gas, since applied organic light emitting material 5 is repelled by the wall face, the film thickness of the organic light emitting layer becomes non-uniform. When the film thickness of the organic light emitting layer becomes non-uniform, there is a concern that the life of the organic EL device becomes short. In addition when the organic light emitting material is repelled by the wall face of the bank, there is a concern that the short circuit of the organic EL device occurs.

Figure 2:
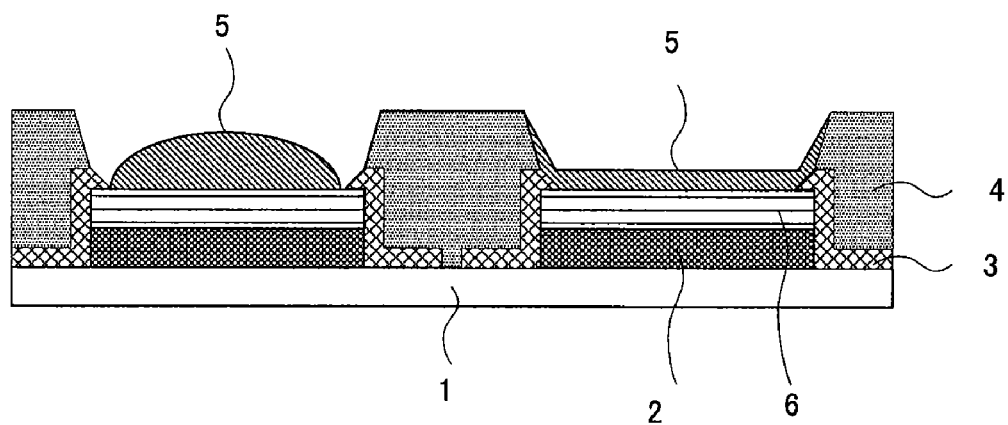
FIG. 2 is a cross-sectional view of the organic light emitting layer in the case when the bank is subjected to the plasma treatment with a fluorine gas.

In addition, the plasma treatment with fluorine makes the plasma density non-uniform. When the plasma density is non-uniform, dispersion of the wettability of the bank occurs among the light emitting elements. FIG. 2 shows a state in which organic light emitting material 5 to be described later is applied in the region defined by bank 4 subjected to the plasma treatment with a fluorine gas. As shown in FIG. 2, in the case when bank 4 is subjected to the plasma treatment with fluorine, affinity with organic light emitting material 5 is different by each pixel, wetting behavior of organic light emitting material 5 differs among pixels. When wetting behavior of organic light emitting material 5 differs among pixels, there is a concern that variation of the thickness of the organic light emitting layer occurs among pixels. The variation of the thickness of the organic light emitting layer among light emitting pixels causes unevenness of the brightness in the organic EL display panel.

Therefore, it is preferable to use a fluorine containing resin as the material of the bank. This is because it is made possible to form a bank having a surface with liquid repellency without conducting the plasma treatment, as the material of the bank comprises a fluorine containing resin. These banks can be formed by using the photolithography technology or the printing technology.

In the case when the bank comprising a fluorine containing resin is formed by using the photolithography technology, a) a step to form a film of a photosensitive resin composition comprising a fluorine containing resin on the inorganic film; and b) a step to expose and develop the film and to expose a part of the inorganic film; are involved.

For forming a film of the photosensitive resin composition comprising a fluorine containing resin on an inorganic resin film, for example, a fluorine containing resin composition is applied by spin coating, die coating, slit coating or the like to form a film made of a fluorine-containing resin composition, and the formed film may be subjected to drying. The drying condition is not particularly limited, and the film may be left standing for 2 to 3 minutes at 80° C.

By subjecting the photosensitive resin composition comprising a fluorine containing resin to exposure and development, an inorganic film in the region where the organic light emitting material to be described later is applied is exposed. In the step of the development of the film, etching by an alkaline solution is carried out. However, in the present invention, the hole injection layer is protected by the inorganic film, there is no concern that the hole injection layer is dissolved by the alkaline solution.

After development, the film is subjected to baking treatment. Thereby, a bank having a surface with a desired wettability is formed. The baking condition is not particularly limited, however, for example, the temperature is approximately 200° C. or higher, and the time is approximately 1 hour.

In the case when the material of the bank comprises a fluorine containing resin, it is inferred that the bake treatment can cause the fluorine component of the fluorine containing resin contained in the film to be transported to the face containing the top of the bank (hereinafter, referred to as "the top face of the bank"). As a result, the fluorine component is localized at the top face of the bank. When fluorine is localized at the top face of the bank, the wettability of the top face of the bank is decreased, and the wettability of the face of the bank contacting with the organic light emitting layer (hereinafter, referred to as "the wall face of the bank") becomes higher than that of the top face of the bank.

Therefore, in the case when the material of the bank comprises a fluorine containing resin and the bank is formed by using the photolithography technology, the wettability of the top face of the bank is decreased, and the wettability of the wall face of the bank is increased. The wettability of the bank will be explained in detail in the chapter "2. the organic EL device of the present invention"

As seen above, in the present invention, it is preferable to form the bank having a desired wettability by using a fluorine-containing resin as the material, rather than by lowering the wettability of the bank by subjecting it to the plasma treatment.

On the other hand, in the case when a resin film with a predetermined pattern is formed by using the printing technology, it may be printed by the method such as intaglio printing, anastatic printing.

In the conventional manufacturing process of the organic EL device, there was a problem that the hole injection layer having a flat surface could not be obtained, because the hole injection layer is dissolved by an etchant alkaline solution in the development step of the bank. However, as described above, in the organic EL device of the present invention, the hole injection layer is covered by the inorganic layer at the time of the development of the bank, the hole injection layer is not dissolved by the alkaline solution.

5) In the fifth step, an exposed inorganic film on the electrode is subjected to etching by using the bank as a mask. By this step, the inorganic film on the hole injection layer is subjected to etching. By etching the inorganic film on the hole injection layer, a hole injection layer with flatness and less surface roughness can be obtained. In addition, by subjecting the inorganic film on the hole injection layer to etching, a hole injection layer having a clean surface which is not contaminated by the residues of the bank can be obtained. On the other hand, the inorganic film between the bank and the substrate remain without subjecting to etching, and defines the region where the organic light emitting material is applied as the bank does (to be described later).

It is preferable that the inorganic film is subjected to etching by the wet-etching method. In addition, the etchant for etching the inorganic film is preferably acid. Because, the hole injection layer is dissolved by alkali, but the hole injection layer has a certain degree of acid resistance. The etchant is selected depending on the kind of the inorganic film. For example, in the case when the inorganic film is a metal, examples of the etchant include mixed acid (a liquid in which conc. sulfuric acid and conc. nitric acid are mixed at the volume ratio of 3:1) and a ferric chloride solution. Especially, a ferric chloride solution is preferable as the etchant of aluminum. On the other hand, in the case when the inorganic film is silicon oxide and the like, examples of the etchant include hydrofluoric acid.

Figure 4:
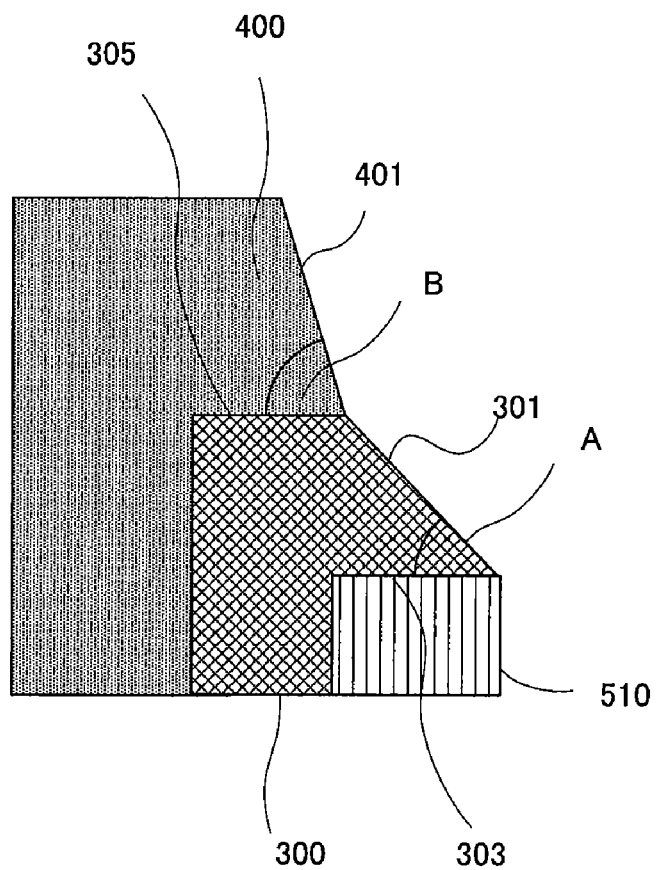
FIG. 4 is an enlarged cross-sectional view of the organic EL device of the present invention.

In the case when the inorganic film is subjected to etching by the wet-etching method, in the boundary between the bank and the inorganic film, no difference in level is formed (see FIG. 4).

In addition, in the present invention it is preferable that the bottom face of the inorganic film extends in the region where the organic light emitting material is applied farther than the top face of the inorganic film (see FIG. 4). In other words, it is preferred that in the present invention the inorganic film has a forward tapered shape.

6) In the sixth step, on the exposed hole injection layer, a composition containing an organic light emitting material is applied. The composition to be applied contains a desired organic light emitting material and a solvent. The solvent is determined according to the kind of the organic light emitting material. Examples of the solvent include aromatic solvents such as anisole. The coating method is not limited particularly. Examples of the coating method include, ink-jet, dispenser, nozzle coating, intaglio printing, anastatic printing and the like. Preferable coating means is ink-jet.

As described above, in the present invention, the wettability of the top face of the bank is low; the wettability of the wall face of the bank is higher than that of the top face of the bank; and the wettability of the inorganic film is further higher than that of the wall face of the bank. Therefore, the organic light emitting material applied in the region defined by the bank and the inorganic film has affinity to the inorganic film and the wall face of the bank, and spread in the entire region defined by the bank uniformly. Therefore, the region where the organic light emitting material is not applied is not generated on the hole injection layer, and thus an organic light emitting layer with uniform thickness can be formed (See FIG. 3).

On the other hand, because the wettability of the top face of the bank is low, there is no concern that the solution of the organic light emitting material in the region defined by the bank leaks from the region defined by the bank.

In addition, as described above, in this invention the bank is preferred to have a forward tapered shape. Moreover, in this invention, difference in level is not formed between the bank and the inorganic film, and further the inorganic film has a tapered shape. In the case when the bank and the inorganic film have such a shape, the organic light emitting material applied in the region defined by the bank and the inorganic film becomes flat in the process of drying, and an organic light emitting layer with an uniform thickness is obtained.

On the other hand, in the cases when difference in level is present between the bank and the inorganic film or when the wall face of the inorganic film is perpendicular to the substrate, there is a concern that the thickness of the organic light emitting layer becomes non-uniform in the neighborhood of the bank and the inorganic film.

Before the organic light emitting material is applied on the hole injection layer, in the region on the hole injection layer defined by the inorganic film and the bank, a solution of the intermediate layer material containing polyaniline-based material may be formed by the ink-jet method, the die coating method, the anastatic printing method or the like.

7) In the seventh step, a cathode is formed on the organic light emitting layer. The cathode is formed, for example, by sputtering.

As seen above, in the manufacturing method of the organic device of the present invention, at the time when the bank is formed, since the hole injection layer is protected by the inorganic film, the hole injection layer having a flat and uncontaminated surface can be obtained. For this reason, an organic EL device having a hole injection layer with a constant work function can be obtained.

Furthermore, according to the present invention, since the organic light emitting material is applied in the region defined by the bank and the inorganic film, the region in which the organic light emitting material is not applied is not present, and then the yield is improved. In addition, since difference in level is not present between the bank and the inorganic film, an organic light emitting layer having a uniform thickness can be obtained.

2. Organic EL Device of the Present Invention

The organic EL device of the present invention is an organic EL device manufactured by the manufacturing method of the organic EL device of the present invention.

The organic EL device of the present invention comprises: 1) a substrate, 2) an anode arranged on the substrate, 3) a hole injection layer arranged on the anode, 4) an organic light emitting layer arranged on the hole injection layer, 5) an inorganic film arranged on the substrate, 6) a bank arranged on the inorganic film and 7) a cathode arranged on the organic light emitting layer.

1) Substrate

The material of the substrate is different depending on whether the organic EL device of the present invention is a bottom emission type or a top emission type. In the case when the organic EL device is a bottom emission type, transparency is required for the substrate, and then examples of the material of the substrate include transparent resins such as polyethylene terephthalate (PET), polyethylene naphthalate (PEN), polyimides (PI) and the like and glass.

On the other hand, in the case when the organic EL device is a top emission type, transparency is not required for the substrate, and the material of the substrate may be any material so long as it is an insulating body.

Anode

The anode is a conductive member arranged on the substrate. The material of the anode is different depending on whether the organic EL device is a bottom emission type or a top emission type.

In the case when the organic EL display panel is a bottom emission type, transparency is required for the anode, and then examples of the material of the anode include indium tin oxide (ITO), indium zinc oxide (IZO), and tin oxides.

On the other hand, in the case when the organic EL display panel is a top emission type, reflexivity is required for the anode, and then examples of the material of the anode include an APC alloy (an alloy of silver, paradium and copper), ARA (an alloy of silver, rubidium and gold), MoCr (an alloy of molybdenum and chromium) and the like.

The thickness of the anode is typically from 100 to 500 nm, and it can be approximately 150 nm.

In addition, the anode may be connected to the drain electrode of the TFT device. In this case, the TFT device functions as the driving TFT. In addition, the anode of the organic EL device may be arranged on the same plane as that of the source electrode or the drain electrode. Of course, the organic EL device may be arranged over the TFT device.

3) Hole Injection Layer

The hole injection layer has a function to support the injection of holes from the anode to the organic light emitting layer to be described later. The hole injection layer is arranged on the anode. The material of the hole injection layer is preferably a transition metal oxide. Examples of the transition metal include tungsten, molybdenum, vanadium, ruthenium, manganese, chromium, nickel, iridium, APC (an alloy of silver, palladium and copper) and the combination thereof. The thickness of the hole injection layer is typically from 10 nm to 100 nm, and it can be approximately 30 nm.

As described above, according to the manufacturing method of the organic EL device of the present invention, the residues of the bank are hardly present on the hole injection layer, because before the formation of the bank the hole injection layer is protected by the inorganic film, and after the formation of the bank the inorganic film on the hole injection layer is removed. As used herein "the residues of the bank are hardly present" means that the concentration of carbon atom in the hole injection layer is 20 atom % or less, preferably 15 atom % or less. The concentration of carbon atom may be determined by using the Electron Spectroscopy for Chemical Analysis (XPS or ESCA) Equipment.

As described above, according to the present invention, since the bank is formed by the composition comprising a fluorine containing resin, and the bank is not required for the plasma treatment, fluorine atom is hardly present on the hole injection layer. As used herein, the phrase " . . . hardly present . . . " means that the concentration of fluorine atom in the hole injection layer is 0.1 atom % or less. The concentration of fluorine atom on the hole injection layer may be determined by using the Electron Spectroscopy for Chemical Analysis (XPS or ESCA) equipment.

4) Organic Light Emitting Layer

The organic light emitting layer contains an organic light emitting material. The organic light emitting layer is arranged in the region defined by the bank and the inorganic film (to be described later). The organic light emitting material contained in the organic light emitting layer is preferably a high molecular weight organic light emitting material. Examples of the high molecular weight organic light emitting material include poly(phenylene vinylene) and its derivatives, polyacetylene and its derivatives, polyphenylene and its derivatives, poly para phenylene ethylene and its derivatives, poly 3-hexyl thiophene and its derivatives and polyfluorene and its derivatives.

In addition, between the hole injection layer and the organic light emitting layer, an intermediate layer may be arranged. The intermediate layer has a role to block the transport of electrons from the organic light emitting layer to the hole injection layer or a role to transport holes efficiently to the organic light emitting layer. Examples of the material of the intermediate layer include triphenylamine or polyaniline.

5) Inorganic Film

The organic EL device of the present invention is characterized by having an inorganic film on the substrate. As described in the manufacturing method of the organic EL device of the present invention, the inorganic film should be arranged between the bank and the substrate, because the bank is formed on the inorganic film, and the inorganic film is subjected to etching using the bank as a mask. The inorganic film defines the region of the organic light emitting layer as the bank does. The wettability of the inorganic film is preferably higher than that of the wall face of the bank. The inorganic film may be in contact with or may be not in contact with the hole injection layer and the electrode. In other words, the inorganic film may be on the hole injection layer (see FIG. 5) or may be only on the substrate near the hole injection layer (see FIG. 7).

Examples of the material of inorganic film include metals such as chromium, nickel, copper, aluminum, silver, gold, platinum, APC, ITO, an AL-Nd alloy, titanium and the like, and insulating inorganic materials such as silicon, silicon oxide, silicon nitride or silicon oxynitride. It is preferable that the material of the inorganic film is different from the aforementioned material of electrode. The metal is preferable as the material of the inorganic film, from the view point of the light blocking effect and easiness of etching. The thickness of the inorganic film is typically from 5 nm to 100 nm, preferably from 30 nm to 70 nm. Generally, the inorganic film has high affinity to a liquid, and so the wettability of the inorganic film is usually higher than that of the bank. It is preferable that the inorganic film has a wettability such that the contact angle of water is 30° or less and the contact angle of anisole is in the range from 1 to 5°.

In the case when the inorganic film is made of metal, the inorganic film arranged between the bank and the substrate can be a black matrix. The black matrix means a light blocking film for improving the contrast of the display by blocking the light from the light emitting pixel (opening section) and having a function to prevent the color mixing between the colored layer of the light emitting pixels. The light blocking inorganic film under the bank can similarly improve the contrast of the organic EL display panel and prevent the color mixing between each pixel.

On the other hand, in the organic EL device, in the case when a light transmissive silicon layer is arranged under the bank, there is a concern that the light leaks from the silicon layer and lowers the contrast of the pixel and the leaked light produces improper operating signals to the neighboring driving TFT. Furthermore, in the case when the inorganic film is made of metal, since the metal has a reflecting property, the inorganic film can also function as a reflecting mirror.

The thickness of the inorganic film consisting of the metal is not limited particularly. However, it is preferable to have the thickness providing the light blocking property to suppress the leak of the light from the inside of the element or the intrusion of the light from the outside into the EL element.

On the other hand, in the case when the inorganic film is made of insulating inorganic material, the inorganic film can define the region where the organic layer emits light. By using the inorganic film made of insulating inorganic material, for example, it is possible to prevent light emission from the organic light emitting layer at unwanted positions such as positions over the contact holes.

6) Bank

The bank is a barrier to define the region of the organic light emitting layer. The material of the bank in the organic EL device of the present invention preferably comprises a fluorine-containing resin which can be developed using an alkaline solution. The fluorine-containing resin may be those in which among the high molecular weight repeating units, at least a part of the repeating unit has a fluorine atom.

Examples of such fluorine containing resin include a fluorinated polyimide resin, a fluorinated polymethacryl resin, a fluorine-containing phenol novolac resin and the like. The height of the bank from the substrate is from 0.1 μm to 2 μm, and is especially preferable from 0.8 μm to 1.2 μm.

As described above, in the present invention, the bank can be prepared by baking (heating) a film of a composition comprising a fluorine containing resin. Through the baking process, the fluorine component contained in the fluorine-containing resin can be localized on the top face of the bank, the wettability of the top face of the bank can be decreased. The concentration of fluorine atom on the top of the bank is preferably from 7 to 20 atom %. The concentration of fluorine atom on the top of the bank can be determined by using the Electron Spectroscopy for Chemical Analysis (XPS or ESCA) Equipment.

The shape of the bank of the present invention may be either a forward tapered shape or a reverse tapered shape, however, a forward tapered shape is preferable. In either case, the wettability of the top face of the bank is preferably lower than that of the wall face of the bank. The contact angle between the top face of the bank and water is preferably 80° or more, and more preferably 90° or more. The contact angle between the top face of the bank and anisole is preferably from 30° to 70°. On the other hand, the contact angle between the wall face of the bank and anisole is preferably from 3° to 30°. The higher contact angle means the lower wettability.

As seen above, by making the wettability of the top face of the bank lower than that of the wall face of the bank, and further by arranging an inorganic film under the bank having a higher wettability than that of the wall face of the bank, there occurs a gradation of the wettability.

In order to demonstrate that gradation of wettability is generated in the organic EL device by the difference in wettability between the bank and inorganic film, the top face model of the bank, the wall face model of the bank and the inorganic film model (model 1) were prepared by the method shown below, and their wettability was determined.

The top face model of the bank of the present invention was deemed as the surface of a fluorine containing acrylic resin subjected to the baking treatment. The wall face model was deemed as a fluorine free acrylic resin subjected to the baking treatment. And the inorganic film model was deemed as the chromium film.

The reason for deeming the wall face model of the bank as a fluorine free acrylic resin subjected to the baking treatment is that it is considered that in the bank of the present invention, fluorine is present only on the top face of the bank, and is absent on the wall face of the bank.

Each film was formed on the 1×3 cm substrate, and the contact angle with water was determined by using the Automatic LC Glass Cooling/Treatment/Inspection Equipment manufactured by Kyowa Interface Science.

As comparative examples, the top face model, the wall face model of the conventional bank and the inorganic film model (model 2) which were subjected to the plasma treatment were prepared, and each wettability was determined. As the top face model and the wall face model of the conventional bank, a resin film comprising a phenol novolac resin subjected to fluorine/oxygen plasma treatment (Product from Nihon Zeon, Product Name: ZWD6216-6) was employed. As the model of the conventional inorganic film, a chromium film subjected to fluorine/plasma treatment was used.

For the plasma treatment, ICP dry etching equipment was used. The condition for the oxygen plasma treatment was set as follows: RF output power 100 W; Pressure 20 Pa; $O_2$ flow rate 200 sccm; Treatment time 5 sec. The condition for the fluorine plasma treatment was set as follows: RF output power 20 W; Pressure 20 Pa; $CF_4$ flow rate 200 sccm; Treatment time 5 sec.

Each film was formed on the 1×3 cm substrate, and the contact angle with water was determined by using the Automatic LC Glass Cooling/Treatment/Inspection Equipment manufactured by Kyowa Interface Science.

In Table 1, the wettability of each model determined by the above described method is shown in terms of contact angle with water. The higher contact angle means a lower wettability.

TABLE 1

|  | Bank Top Face | Bank Bottom Face | Chromium Film |
| --- | --- | --- | --- |
| Model 1 | 95° | 58° | 27° |
| Model 2 | 103° | 103° | 38° |

In the conventional technology, the wettability of the top face of the bank and the wettability of the wall face of the bank are both low)(103°). On the other hand, it is realized that in the present invention, while the wettability of the top face of the bank is substantially low)(95°), the wettability of the wall face of the bank is high)(58°). In addition, the wettability of the conventional chromium film (contact angle with water: 38°) is lower than the wettability of the chromium film (contact angle with water: 27°) of the present invention. The results show the bank top face, bank wall face and inorganic film showed gradations of wettability.

Relation Between Bank and Inorganic Film

As described above, the present invention is characterized in that there is no difference in level between the bank and the inorganic film. Referring to the figures, the boundary between the wall face of the bank and the wall face of the inorganic film of the present invention will be explained.

Figure 3:
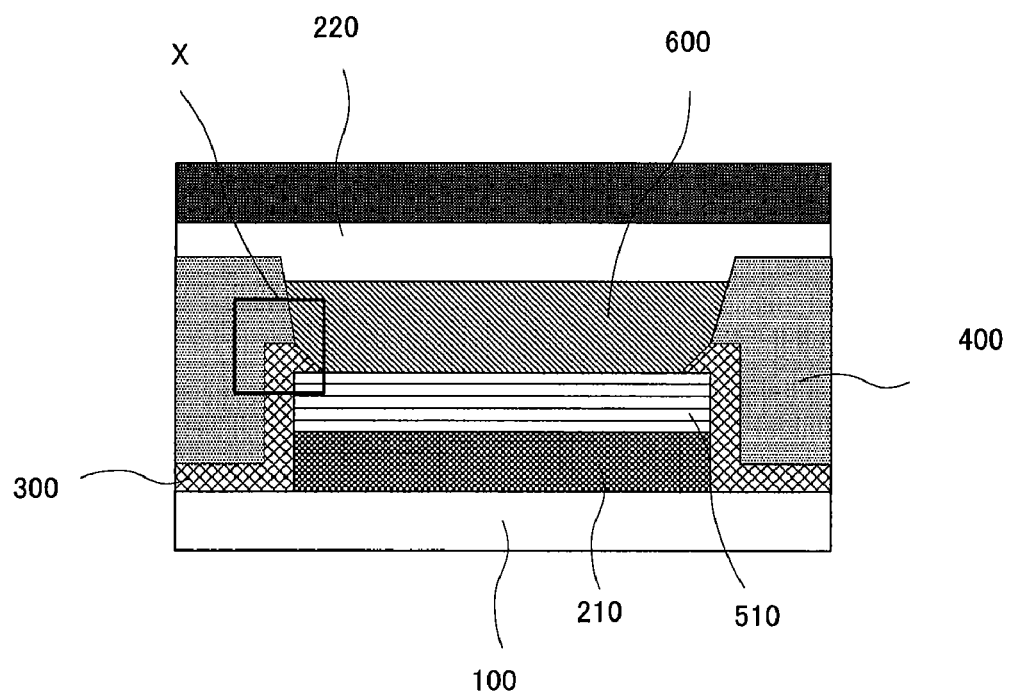
FIG. 3 is a cross-sectional view of the organic EL device of the present invention.

FIG. 3 is a cross-sectional view of the organic EL device of the present invention. The organic EL device of the present invention comprises: substrate 100; anode 210; hole injection layer 510; organic light emitting layer 600; bank 400; inorganic film 300; and cathode 220.

FIG. 4 is an enlarged view of the square X shown in FIG. 3. In FIG. 4, organic light emitting layer 600 is not shown.

As shown in FIG. 4, in this invention, there is no difference in level between bank 400 and inorganic film 300. In other words, wall face 401 of the bank and wall face 301 of the inorganic film are continued. Here, "there is no difference in level" means that the distance between the end portion of bottom face of the bank and the end portion of top face 305 of the inorganic film is 5 μm or less.

In addition, it is preferable that the taper angle A of the inorganic film is from 20 to 90°. In other words, the inorganic film preferably does not have a reverse tapered shape. Furthermore, it is preferable that bottom face 303 of the inorganic film extends in the region, which is defined by bank 400 and inorganic film 300, 1 nm to 300 nm away from top face 305 of the inorganic film. In other words, bottom face 303 of the inorganic film preferably has a forward tapered shape. The taper angle A of the inorganic film preferably equals to the taper angle B of the bank.

Such a boundary between the wall face of the bank and the wall face of the inorganic film can be obtained by subjecting the inorganic film to etching by the wet-etching method using the bank as mask.

7) Cathode

The cathode is arranged on the organic light emitting layer. The material of the cathode is different depending on whether the organic EL device of the present invention is a bottom emission type or a top emission type. In the case when the organic EL device of the present invention is a top emission type, light permeability is required for the cathode, and examples of the material of the cathode include ITO, IZO and the like. On the other hand, in the case when the organic EL device of the present invention is a bottom emission type, the material of the cathode may be any so long as it is conductive.

As seen above, according to the organic EL device of the present invention, since the hole injection layer is flat and since it has an uncontaminated surface by the residues of the bank and fluorine, the driving voltage is low and the light emitting efficiency is high. In addition, since the organic EL device of the present invention has an organic light emitting layer having uniform thickness, the product lifetime is long 3. On Organic EL Device of the Present Invention The organic EL display panel may be formed by arranging the organic EL devices of the present invention on the same plane in a matrix.

In addition, in the case when the inorganic film is made of insulating inorganic material such as silicon and the like, in the organic EL display panel on which the organic EL devices are arranged in a matrix, the inorganic films of the neighboring organic EL devices may be connected. As the result of connection of the inorganic films of the neighboring organic EL devices, the connected inorganic films constitute a grid like line device. By providing the line device, the bank can be formed linearly. By forming the linear bank in a stripe pattern, a pattern of linear organic light emitting layers can be formed by die coating, and an organic light emitting layer with a uniform film thickness can be formed easily.

Referring to the attached drawings, the embodiments of the present invention will be explained.

(Embodiment 1)

In Embodiment 1, a top emission type organic EL device will be explained.

Figure 5:
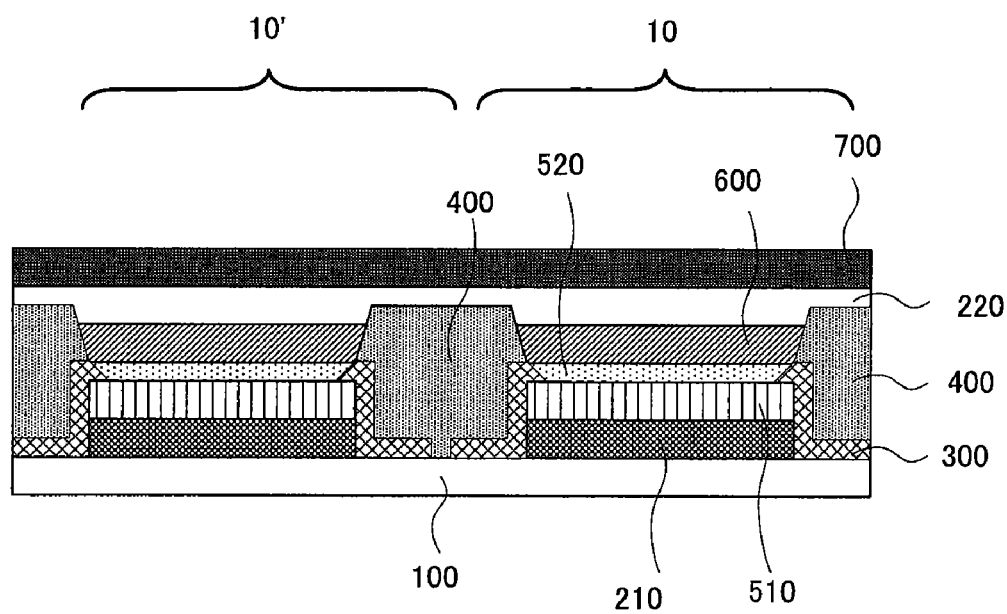
FIG. 5 is a cross-sectional view of the organic EL device of the embodiment 1.

FIG. 5 is a cross-sectional view of organic EL device 10 of Embodiment 1 of the present invention.

Organic EL device 10 in FIG. 5 comprises substrate 100, reflecting anode 210, hole injection layer 510, intermediate layer 520, organic light emitting layer 600, inorganic film 300, bank 400, transparent cathode 220 and sealing film 700.

Substrate 100 is, for example, a glass plate.

Reflecting anode 210 is a conductive layer arranged on substrate 100. Reflecting anode 210 is, for example, made of APC alloy. The thickness of reflecting anode 210 is preferably from 100 to 200 nm.

Hole injection layer 510 is arranged on reflecting anode 210. Hole injection layer 510 is consisted of tungsten oxides ($WO_x$). The preferable thickness of hole injection layer 510 is from 20 to 50 nm.

Intermediate layer 520 is arranged on hole injection layer 510. Intermediate layer 520 is, for example, made of polyaniline. The preferable thickness of intermediate layer 520 is from 20 to 50 nm.

Organic light emitting layer 600 is arranged on intermediate layer 520. The preferable thickness of organic light emitting layer 600 is from 50 nm to 150 nm.

Inorganic film 300 is arranged between substrate 100 and bank 400, and between reflecting anode 210 and bank 400. The preferable thickness of inorganic film 300 is from 5 nm to 100 nm. Inorganic film 300 defines the region of intermediate layer 520 and organic light emitting layer 600, as bank 400 to be described later does.

Bank 400 is arranged on inorganic film 300 such that bank 400 defines the region of intermediate layer 520 and organic light emitting layer 600. Bank 400 is, for example, made of a fluorinated methacryl resin. The preferable height of bank 400 from inorganic film 300 on the substrate is from 100 nm to 3 µm.

Transparent cathode 220 is a light transmissive conductive layer arranged on organic light emitting layer 600. The material of transparent cathode 220 is, for example, ITO.

Sealing film 700 is provided to protect reflecting anode 210, hole injection layer 510, intermediate layer 520, organic light emitting layer 600 and transparent cathode 220 against water, heat, impact and the like. Sealing film 700 is arranged on transparent cathode 220. Examples of the material of sealing film 700 include silicon nitride and silicon oxynitride. The preferable thickness of sealing film 700 is from 20 nm to 200 nm.

When a voltage is applied between reflecting anode 210 and transparent cathode 220, holes from reflecting anode 210 and electrons from transparent cathode 220 are injected in organic light emitting layer 600. The injected holes and electrons combine in the inside of organic light emitting layer 600 and excitons are generated. By the action of these excitons, organic light emitting layer 600 emits the light, and the light is outputted through transparent cathode 220.

In addition, inorganic film 300 of organic EL device 10 of the embodiment of the present invention does not contact with inorganic film 300 of organic EL device 10' as shown in FIG. 5. By employing such a structure, for example, even when inorganic film 300 is made of metal, occurrence of short circuit between organic EL device 10 and organic EL device 10' can be prevented.

Figure 6A:
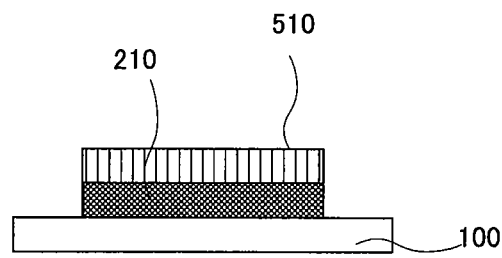
FIGS. 6A to 6F show a manufacturing flow chart of the organic EL device of the embodiment 1.
Figure 6B:
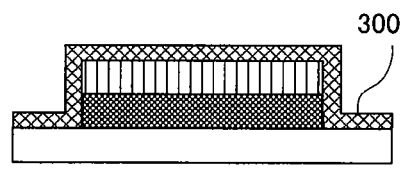
Figure 6C:
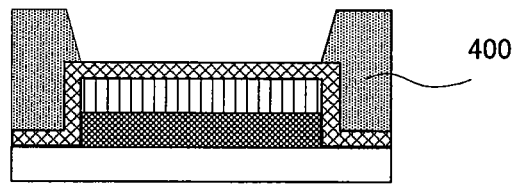
Figure 6D:
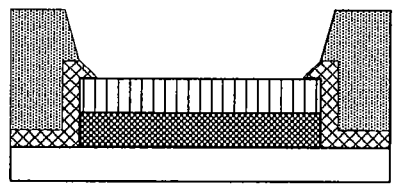
Figure 6E:
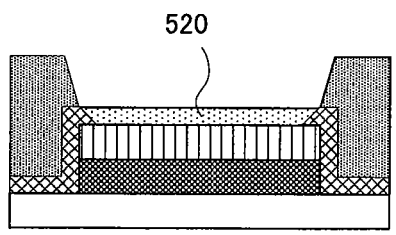
Figure 6F:
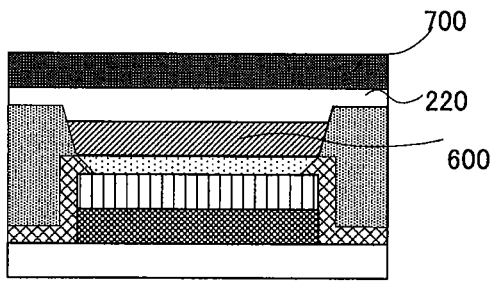

FIGS. 6A to 6F are a schematic view showing an example of the manufacturing process of organic EL device 10. As shown from FIG. 6A to FIG. 6F, the manufacturing process of organic EL device 10 comprises: 1) a first step to provide substrate 100 having reflecting anode 210 and hole injection layer 510 (FIG. 6A); 2) a second step to form inorganic film 300 on substrate 100 such that the inorganic film covers hole injection layer 510 (FIG. 6B); 3) a third step to form bank 400 on inorganic film 300 (FIG. 6C); 4) a fourth step to expose hole injection layer 510 by etching inorganic film 300 using bank 400 as a mask (FIG. 6D); 5) a fifth step to form intermediate layer 520 on hole injection layer 510 (FIG. 6E); 6) a sixth step to form on intermediate layer 520, organic light emitting layer 600, transparent cathode 220 and sealing film 700 in this order (FIG. 6F).

In the first step, for example, a) a step to form a film of the material of reflecting anode 210 on substrate 100 by the vapor-deposition method, sputtering and the like; b) a step to form the film of the material of hole injection layer 510 on the film of the material of reflecting anode 210 by the vapor-deposition method, sputtering and the like; and c) a step to subject reflecting anode 210 and hole injection layer 510 to patterning by etching are included.

2) In the second step, inorganic film 300 is formed, for example, by sputtering.

3) In the third step, bank 400 is formed on inorganic film 300 such that inorganic film 300 on hole injection layer 510 is exposed. Bank 400 is formed, for example, by the photolithography method. Inorganic film 300 formed on hole injection layer 510 protect hole injection layer 510 from an alkaline solution which is the etchant in the formation of bank 400. This prevents hole injection layer 510 from dissolution by the alkaline solution.

Furthermore, inorganic film 300 protects the surface of hole injection layer 510 from the residues of the bank. This prevents the surface of hole injection layer 510 from the contamination by the residues of the bank.

4) In the forth step, inorganic film 300 is subjected to wet-etching using hydrofluoric acid.

5) In the fifth step, intermediate layer 520 is formed on hole injection layer 510, for example, by the ink-jet method.

6) In the sixth step, organic light emitting layer 600 is formed on intermediate layer 520, for example, by the ink-jet method. Furthermore, transparent cathode 220 is formed, for example, by the vapor-deposition method, and sealing film 700 is formed, for example, by the CVD (Chemical Vapor Deposition) method.

As seen above, by protecting the hole injection layer with the inorganic film at the time of forming the bank, the hole injection layer having a flat and uncontaminated surface can be obtained. Since such a hole injection layer has a constant work function and a low surface resistance, an organic EL device with low driving voltage and high light emitting efficiency can be provided.

In addition, by forming the bank using a fluorine containing resin, fluorine plasma treatment of the bank can be omitted, and an organic light emitting layer with a flat surface and uniform thickness can be obtained.

In addition, by making the wettability of the top face of bank 400 lower than that of the wall face of bank 400 and by arranging inorganic film 300 having the wettability higher than that of the wall face of bank 400 between bank 400 and substrate 100, an organic light emitting layer with a uniform thickness can be obtained.

(Embodiment 2)

In Embodiment 1, the organic EL device with which the hole injection layer and the inorganic film are in contact each other was explained. On the other hand, in Embodiment 2, an organic EL device will be described in which the hole injection layer and the inorganic film are separated.

Figure 7:
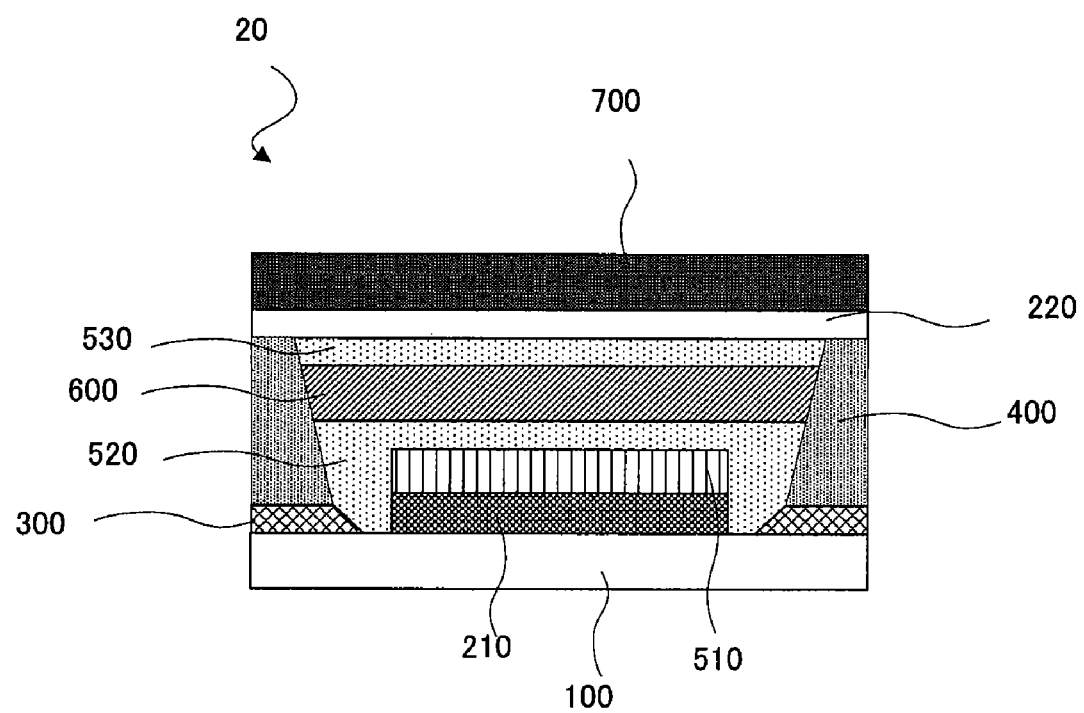
FIG. 7 is a cross-sectional view of the organic EL device of the embodiment 2.

FIG. 7 is a cross-sectional view of organic EL device 20 of Embodiment 2. In FIG. 7, the organic EL device comprises: substrate 100; reflecting anode 210; hole injection layer 510; intermediate layer 520; organic light emitting layer 600; electron transporting layer 530; transparent cathode 220; sealing film 520; bank 400; and inorganic film 300.

Materials and the like of substrate 100, reflecting anode 210, inorganic film 300, hole injection layer 510, intermediate layer 520, organic light emitting layer 600, transparent cathode 220, film 700 and bank 400 may be the same as explained in Embodiment 1.

Electron transporting layer 530 is a layer to transport electrons injected from transparent cathode 220 to organic light emitting layer 600. Electron transporting layer 530 is arranged between organic light emitting layer 600 and transparent cathode 220. Examples of the material of electron transporting layer 530 include barium, aluminum, phthalocyanine, lithium fluoride and the combination thereof. Preferable electron transporting layer 530 is a multilayer comprising a barium layer of from 1 nm to 20 nm and an aluminum layer of from 20 nm to 100 nm.

In this embodiment, inorganic film 300 is separated from reflecting anode 210. Therefore, in the case when inorganic film 300 is a metal, even when the inorganic film contacts with neighboring inorganic films of the other organic EL devices, there occurs no short circuit between the devices.

FIGS. 8A to 8F are a schematic view showing an example of the manufacturing process of organic EL display panel 20. As shown in FIGS. 8A to 8F, the manufacturing method of organic EL display panel 20 comprises: 1) a first step to provide substrate 100 having reflecting anode 210 and hole injection layer 510 (FIG. 8A); 2) a second step to prepare inorganic film 300 on substrate 100 such that the film 300 covers hole injection layer 510 (FIG. 8B); 3) a third step to form bank 400 on inorganic film 300 (FIG. 8C); 4) a fourth step to expose hole injection layer 510 by etching inorganic film 300 (FIG. 8D); 5) a fifth step to form intermediate layer 520 such that the intermediate layer covers hole injection layer 510 (FIG. 8E); 6) a sixth step to form organic light emitting layer 600, electron transporting layer 530, transparent cathode 220 and sealing layer 700 (FIG. 8F).

The method of forming reflecting anode 210, hole injection layer 510, inorganic film 300, bank 400, intermediate layer 520, organic light emitting layer 600, transparent cathode 220 and sealing layer 700 may be identical to the method explained in the manufacturing method of the organic EL device of Embodiment 1. In addition, electron transporting layer 530 is formed, for example, by the vapor-deposition method.

(Embodiment 3)

As explained in Embodiments 1 and 2, the hole injection layer of the present invention is preferably oxides of the transition metal, however, the material of the hole injection layer may be PEDOT-PSS (polyethylene dioxythiophen doped with polystyrenesulfonate). In the case when the material of hole injection layer is PEDOT-PSS, the surface of the anode can be protected from the contamination of the residues of the bank.

Figure 9:
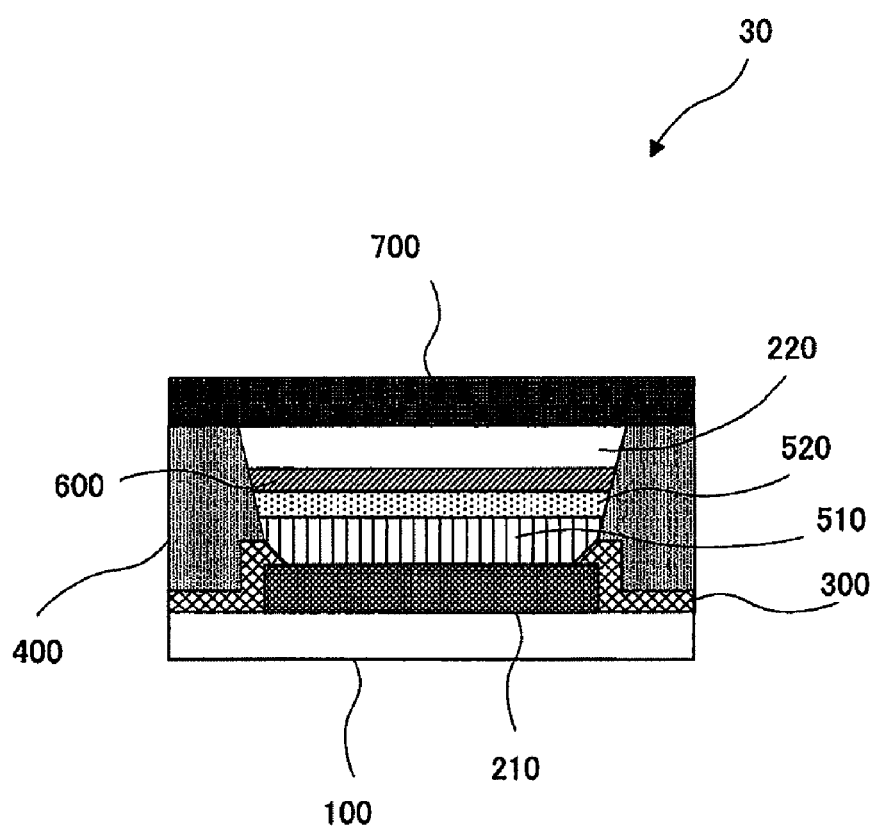
FIG. 9 is a cross-sectional view of the organic EL device of the embodiment 3.

In Embodiment 3, a case in which the material of hole injection layer is PEDOT-PSS (polyethylene dioxythiophen doped with polystyrenesulfonate) will be explained. FIG. 9 is a cross-sectional view of organic EL device 30 of Embodiment 3 of the present invention.

Organic EL device 30 in FIG. 9 comprises: substrate 100, transparent anode 210, hole injection layer 510, intermediate layer 520, organic light emitting layer 600, inorganic film 300, bank 400, cathode 220 and sealing film 700.

The material of substrate 100, intermediate layer 520, organic light emitting layer 600, inorganic film 300, bank 400, cathode 220 and sealing film 700 may be identical to that explained in Embodiment 1.

Transparent anode 210 is a light transmissive conductive layer arranged on substrate 100. Transparent anode 210 is ITO film with the thickness, for example, of from 100 nm to 200 nm.

Hole injection layer 510 is arranged in the region defined by bank 400 on transparent anode 210. Hole injection layer 510 is made of, for example, PEDOT-PSS (polyethylene dioxythiophen doped with polystyrenesulfonate). The preferable thickness of hole injection layer 510 is from 20 nm to 50 nm.

Cathode 220 is a light reflective conductive layer arranged on organic light emitting layer 600. The material of cathode 220 is not limited particularly so long as it is light reflective. Cathode 220 is formed of, for example, a barium layer of from 1 nm to 20 nm in thickness or a lithium fluoride layer of from 20 nm to 100 nm in thickness.

Figure 10A:
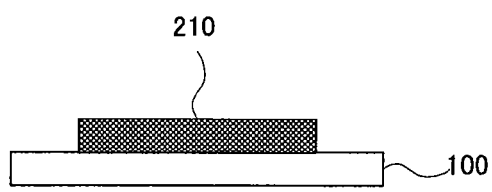
FIGS. 10A to 10E show a manufacturing flow chart of the organic EL device of the embodiment 3.
Figure 10B:
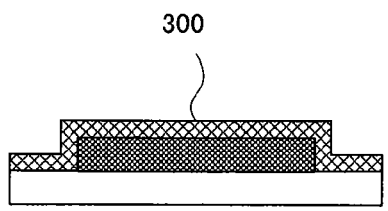
Figure 10C:
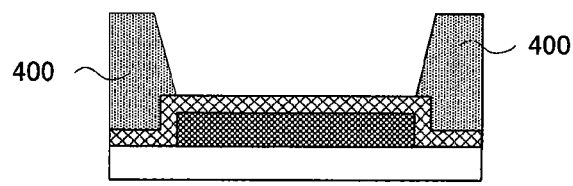
Figure 10D:
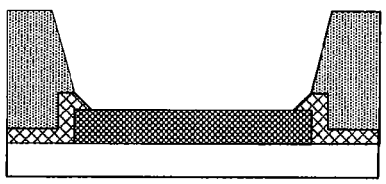
Figure 10E:
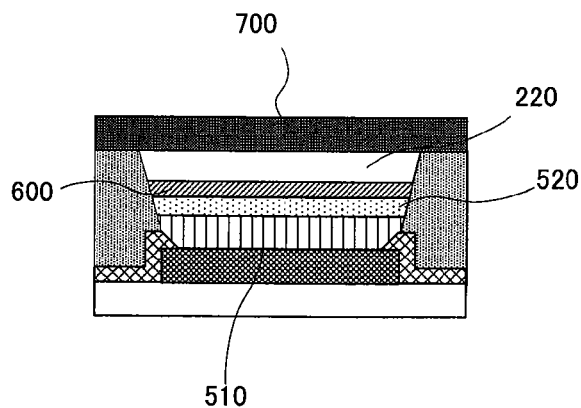

FIGS. 10A to 10E are a schematic diagram showing an example of the manufacturing process of organic EL device 30. As shown in FIG. 10A to FIG. 10E, the manufacturing process of organic EL device 30 comprises: 1) a first step to provide substrate 100 on which anode 210 is arranged (FIG. 10A); 2) a second step to form inorganic film 300 such that the inorganic film 300 covers transparent anode 210 on substrate 100 (FIG. 10B); 3) a third step to form bank 400 on inorganic film 300 (FIG. 10C); 4) a fourth step to expose transparent anode 210 by subjecting inorganic film 300 to etching by using bank 400 as a mask (FIG. 10D); 5) a fifth step to form hole injection layer 510 on transparent anode 210, intermediate layer 520, organic light emitting layer 600, transparent anode and sealing layer 700 (FIG. 10E).

The method of forming inorganic film 300, bank 400, intermediate layer 520, organic light emitting layer 600 and sealing layer 700 may be identical to the method explained in the manufacturing method of the organic EL device of Embodiment 1.

Transparent anode 210 is formed, for example, by sputtering. Hole injection layer 510 is formed in the region defined by bank 400, for example, by the ink-jet method. Cathode 220 is formed, for example, by sputtering.

As seen above, by protecting the anode with the inorganic film, cleanness of the surface of the anode can be kept. Since the work function of the anode having a clean surface is constant, an organic EL device with high light emitting efficiency can be provided.

EXAMPLE

For showing that a hole injection layer whose surface is not contaminated with the residues of the bank can be obtained by the method of the present invention, following experiments were conducted.

On the glass substrate of 6 inch in diameter, a chromium film (50 nm in thickness) was formed by sputtering. On the chromium film formed on the glass substrate, a coating film (1 μm in thickness) of a photosensitive fluorine-based acrylic resin (polyacrylic acid in which the hydrogen of the ethylene chain is replaced with a fluorine) was formed. The coating film was subjected to patterning by the photolithography method (applying the material, pre-baking, exposure to light, development, post-baking), and a bank was formed to expose a part of the chromium film. Then, the exposed part of the chromium film on the substrate was subjected to wet-etching using mixed acid to expose a part of the glass substrate. In this way, the model (model 1) of exposed substrate of the present invention was obtained.

The element ratio on the glass substrate surface exposed by etching of the chromium film was determined by X-ray Photoelectron Spectroscopy (XPS). The results are shown in Table 2. The XPS measurement was conducted in the energy range of from 0 eV to 1400 eV.

COMPARATIVE EXPERIMENT

Without forming the chromium film, the bank was formed on the glass substrate similarly to model 1, and by exposing a part of the glass substrate, a model (model 2) of the conventional technology was formed. The element ratio on the exposed glass substrate surface was determined by X-ray Photoelectron Spectroscopy (XPS). The results are shown in Table 2.

In Table 2, C represents carbon content (atom %), and F represents fluorine content (atom %). While the carbon content on the glass substrate of model 2 is 28.1 atom %, the carbon content on the glass substrate of model 1 is 14.2 atom %, which is approximately ½ of the former. In addition, while the fluorine content on the glass substrate of model 2 is 1.1 atom %, the fluorine content on the glass substrate of model 1 is less than 0.1 atom %, which is $1/10$ or less of the former.

From these results, it was shown that, according to the method of the present invention, a hole injection layer having a surface which is not contaminated with the residues of the bank can be obtained.

TABLE 2

|  | C | F | Others |
|---|---|---|---|
| Model 1 | 14.2 | <0.1 | 85.8 |
| Model 2 | 28.1 | 1.1 | 70.7 |

EXAMPLES

By referring to examples, the organic EL device of the present invention will be explained. The examples below are not intended to limit the scope of the present invention.

On the glass substrate of 30 mm×30 mm, an anode (ITO film with thickness of 80 nm) was formed by sputtering. Then the hole injection layer (a tungsten oxide film with thickness of 50 nm) was formed on the glass substrate and the ITO film by the sputtering method. Then, the inorganic film (a chromium film with thickness of 50 nm) was formed by sputtering such that the inorganic film covers the hole injection layer. Then, on the inorganic film, a coating film (thickness: 1 μm) of a photosensitive fluorine-based acrylic resin was formed. The coating film was subjected to patterning by the photolithography method (applying the material, pre-baking, exposure to light, development, post-baking) and the bank for exposing a part of the inorganic film was formed. Then, using the bank as a mask, the hole injection layer (a tungsten oxide film) was exposed by subjecting the inorganic film to wet-etching using mixed acid.

Then, on the exposed hole injection layer, a compound containing triphenylamine was applied by the spin-coating method, and the obtained coating film was baked to form the intermediate layer (thickness: 20 nm). Then, a fluorene-based compound was applied by the spin-coating method, and the obtained coating film was baked to form an organic light emitting layer (thickness: 80 nm).

Then, a barium film (thickness: 5 nm) and an aluminum film (thickness: 120 nm) were formed and the electron transporting layer and the cathode were formed. Finally, the sealing film was attached by using a UV curing adhesive to seal the organic EL device.

Figure 11:
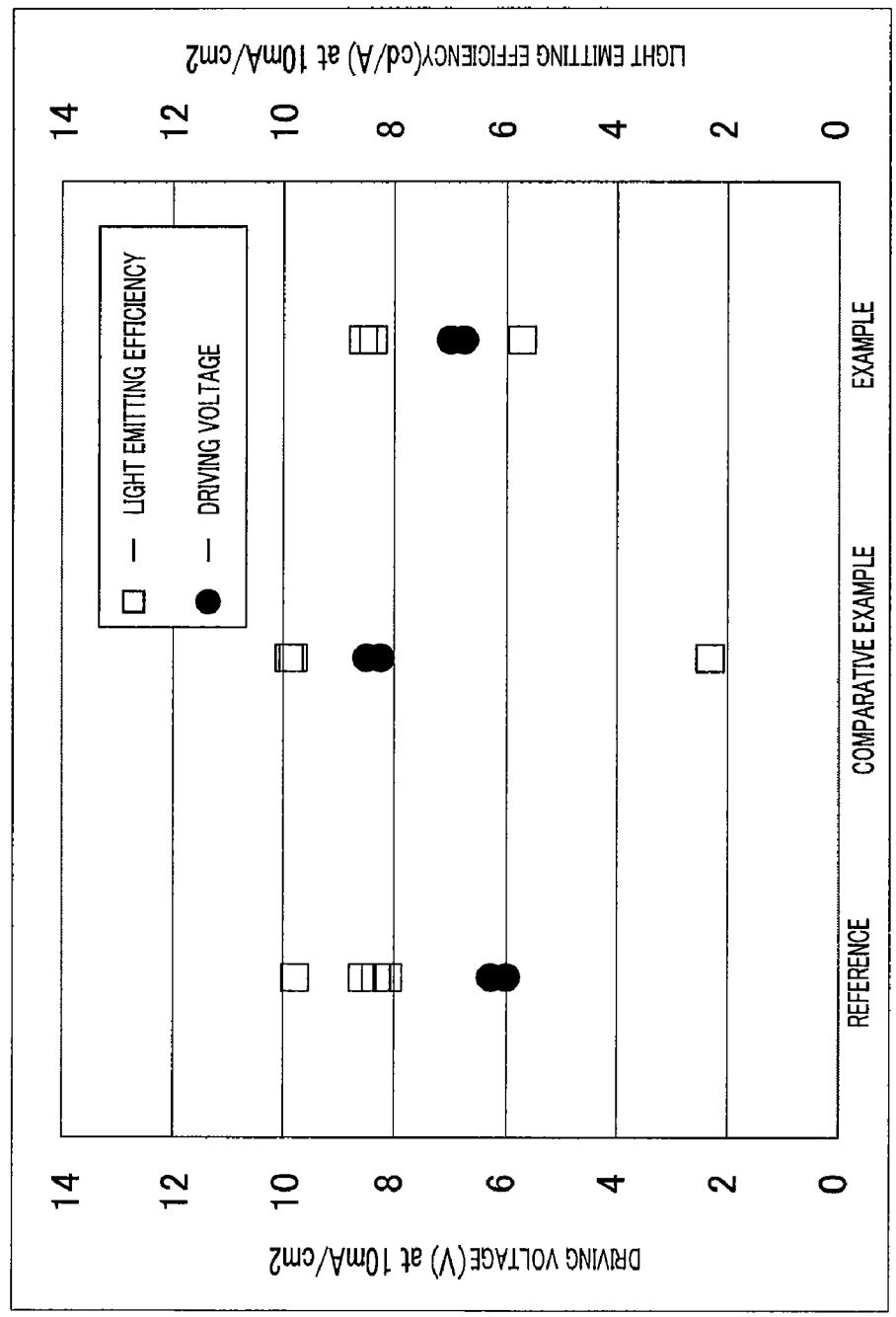
FIG. 11 is a graph showing the results of the examples.

The driving voltage and the light emitting efficiency of the organic EL device prepared in this manner are shown in FIG. 11.

COMPARATIVE EXAMPLE

In the comparative example, the organic EL device was prepared by the same method as that of the examples except that a step to form the inorganic film and a step to etch the inorganic film are not involved. The driving voltage and the light emitting efficiency of the obtained organic EL device are shown in FIG. 11.

(Reference)

The sample for evaluating dispersion of the values of measurement was prepared as below.

On the glass substrate of 30 mm×30 mm, an ITO film was formed by sputtering. Then, on the glass substrate and on the ITO film (thickness: 80 nm), PEDOT-PSS (polyethylene dioxythiophen doped with polystyrenesulfonate) was applied by the spin-coating method, and the obtained coating film was baked to form the hole injection layer (thickness: 65 nm). Then, a compound containing triphenyl amine was applied by the spin-coating method, and the obtained coating film was baked to form the intermediate layer (thickness: 20 nm). Then, a fluorene-based compound was applied by the spin-coating method, and the obtained coating film was baked to form an organic light emitting layer (thickness: 80 nm).

Then, a barium film (thickness: 5 nm) and an aluminum film (thickness: 120 nm) were formed by the vapor deposition method and the electron transporting layer and the cathode were formed. Finally, the sealing film was attached by using a UV curing adhesive to seal the organic EL device.

As shown in the graph of FIG. 11, it is realized that the error of the light emitting efficiency is ±1 cd/A, and the error of the driving voltage of the reference is approximately ±0.15 V.

In addition, as shown in the graph of FIG. 11, the driving voltage of the organic EL device of the example (approximately 6.9V) is lower than the driving voltage of the organic EL device of the comparative example (approximately 8.1V). There was no significant difference in the light emitting efficiency between the organic EL device of the example and that of the comparative example.

The results shown in FIG. 11 suggests that by protecting the hole injection layer against an alkaline solution by an inorganic film, and by removing the inorganic film on the hole injection layer after the formation of the bank, an organic EL device with low driving voltage can be provided.

As the causes of higher driving voltage of the organic EL device of the comparative example than that of the organic EL device of the example, it is considered that in the organic EL device of the comparative example, the surface resistance of the hole injection layer is increased for the reason that a large amount of carbon and fluorine are present on the hole injection layer, and the hole injection layer was dissolved by treatment with an alkaline solution at the time of development, and the work function of the hole injection layer was changed.

On the other hand, in the organic EL device of the example, since the hole injection layer is protected by the inorganic film at the time of development, the hole injection layer is not dissolved by the alkaline solution and also is not contaminated by the residues of the bank or fluorine. Therefore, it is considered that the driving voltage of the organic EL device of the example becomes lower than that of the organic EL device of the comparative example.

This application claims priority of Japanese Patent Application 2007-318978 filed on Dec. 10, 2007, the entire contents of which are incorporated herein by reference.

Industrial Applicability

According to the manufacturing method of the organic EL device of the present invention, it is possible to manufacture an organic EL device having lower driving voltage, higher light emitting efficiency and longer life.

1. Substrate
2. Electrode
3. Inorganic film
4. Bank
5. Organic light emitting material
6. Hole injection layer
10, 10', 20, 30, Organic EL device
100 Substrate
210 Anode
220 Cathode
300 Inorganic film
400 Bank
510 Hole injection layer
520 Intermediate layer
530 Electron transporting layer
600 Organic light emitting layer
700 Sealing layer

The invention claimed is:

1. An organic EL device, comprising:
a substrate;
an anode arranged on the substrate;
a hole injection layer of transition metal oxide arranged on the anode;
an organic light emitting layer arranged on the hole injection layer;
a cathode arranged on the organic light emitting layer;
an inorganic film arranged on the substrate; and
a bank comprising a fluorine-containing resin arranged on the inorganic film;
wherein:
the bank and the inorganic film define a region of the organic light emitting layer, and an edge of a top surface of the organic light emitting layer contacts a face of the bank;
a distance between an end portion of a bottom face of the bank and an end portion of a top face of the inorganic film is not greater than 5 μm; and
a bottom face of the inorganic film extends in a region defined by the bank and the inorganic film that is beyond the top face of the inorganic film,
a wettability of a top face of the bank is lower than a wettability of a wall face of the bank; and
a wettability of the wall face of the bank is lower than a wettability of the inorganic film.

2. The organic EL device according to claim 1, wherein the bank has a forward tapered shape.

3. The organic EL device according to claim 1, wherein:
the thickness of the inorganic film is from 5 nm to 100 nm; and
the material of the inorganic film is selected from the group consisting of silicon, silicon oxide, silicon nitride and silicon oxynitride.

4. The organic EL device according to claim 1, wherein:
the thickness of the inorganic film is from 5 nm to 100 nm; and
the material of the inorganic film is selected from the group consisting of chromium, nickel, copper, aluminum, silver, gold, platinum, APC, ITO, AL-Nd alloy, and titanium.

5. The organic EL device according to claim 1, wherein the anode and the hole injection layer are separated from the inorganic film.

6. An organic EL display panel comprising two or more organic EL devices according to claim 1 arranged on the same plane, wherein:
the material of the inorganic film is selected from the group consisting of chromium, nickel, copper, aluminum, silver, gold, platinum, APC, ITO, AL-Nd alloy and titanium; and
the inorganic films of the neighboring organic EL devices are separated from each other.

7. An organic EL display panel comprising two or more organic EL devices according to claim 1 arranged on the same plane, wherein:
- the material of the inorganic film is selected from the group consisting of silicon, silicon oxide, silicon nitride, and silicon oxynitride;
- the inorganic films of the neighboring organic EL devices are connected to each other; and
- the connected inorganic films form a grid.

8. The organic EL device according to claim 1, wherein a cross-sectional shape of the bank and the inorganic film are substantially inclined with respect to a transverse plane of the substrate.

9. The organic EL device according to claim 1, wherein a thickness of the organic film is between 5 nm to 100 nm.

10. The organic EL device according to claim 1, wherein the inorganic film has a forward tapered shape.

* * * * *